United States Patent [19]
Lee et al.

[11] Patent Number: 5,760,484
[45] Date of Patent: Jun. 2, 1998

[54] ALIGNMENT MARK PATTERN FOR SEMICONDUCTOR PROCESS

[75] Inventors: Chang-Hsun Lee; Fu-Cheng Lin; Chen-Tai Kuo, all of Hsinchu, Taiwan

[73] Assignee: Mosel Vitelic Inc., Hsinchu, Taiwan

[21] Appl. No.: 798,560

[22] Filed: Feb. 11, 1997

[51] Int. Cl.⁶ .................................................. H01L 23/544
[52] U.S. Cl. ........................................ 257/797; 356/401
[58] Field of Search ............................ 257/797; 356/401

[56] References Cited

U.S. PATENT DOCUMENTS

| | | | |
|---|---|---|---|
| 4,823,012 | 4/1989 | Kosugi | 250/491.1 |
| 5,051,807 | 9/1991 | Morozumi | 357/40 |
| 5,684,333 | 11/1997 | Moriyama | 257/797 |

*Primary Examiner*—Sara W. Crane
*Assistant Examiner*—Douglas A. Wille
*Attorney, Agent, or Firm*—Bacon & Thomas

[57] ABSTRACT

An alignment mark for increasing the accuracy of an alignment includes a cross pattern, two horizontal line patterns having serrated shape. The cross pattern is typically formed over a scribe line for alignment in semiconductor process. The cross pattern includes a vertical line and a horizontal line. The vertical line is vertical to the scribe line while the horizontal line is parallel to the scribe line. The horizontal patterns which are parallel to the scribe line are respectively connected to one end of the vertical line. The horizontal patterns have serrated patterns which are used to change the shape of a noise signal. The high of the serrated shape pattern is about 3 micro meters while the width of the serrated shape pattern is about 3 micro meters.

18 Claims, 2 Drawing Sheets

ALIGNMENT MARK PATTERN FOR SEMICONDUCTOR PROCESS

FIELD OF THE INVENTION

The present invention relates to an alignment mark that is formed on a scribe line, and especially to an alignment mark for increasing the accuracy of an alignment in a semiconductor process.

BACKGROUND OF THE INVENTION

The semiconductor technology that ultimately led to the integrated circuit (IC) was over 75 years in the making. Since the creation of the first integrated circuit in 1960, there has been an ever increasing density of density on semiconductor substrates. Circuit design has a trend to space-saving features. Two or three layers of interconnections between circuit elements are now used, and the number of active devices required to perform a given function has decreased. For example, some of the early DRAM memory cells required six transistors, whereas now one transistor and one capacitor suffice. The number of devices manufactured on a chip exceeded the accepted definition of very large scale integration (VLSI). Process in VLSI manufacturing technology seems likely to continue to proceed in this manner.

Alignment is the key way to make sure that a layer is aligned with a sublying layer. Since multilevel interconnections are formed in a chip in IC fabrication. If one of the layers is misalignment then the chip will be out of order. Alignment accuracy is considered the accuracy with which a mark from one level matches that of another. For contact etching, photoresist patterning or wafer deposition, there are several alignment marks per level per wafer. Overlay accuracy considers how accurately the patterns of one level match their corresponding patterns on other levels. To achieve the necessary measurement precision, alignment marks are used. The alignment marks are typically incorporated into the chip or put in or on the scribe lines.

Turning to FIG. 1, an alignment mark 10 is generally a cross pattern formed on or in a pad layer 12. The pad layer 12 is formed over a scribe line 14. Generally speaking, the width of the scribe line 14 is less than 100 micro meters. In alignment procedure, a light beam scans the alignment mark in the X direction and Y direction respectively to make sure the pattern is in the right position or not. Referring to FIG. 2, while the light beam scans the alignment mark in the Y direction or in the X direction, a peak 16 will be shown on the screen of an oscilloscope causing by a step difference between the alignment mark 10 and the pad layer 12. The pad layer 12 and the alignment mark 10 are composed of any suitable material such as metal, silicon or dielectric.

Unfortunately, there are step differences between the pad layer 12 and the scribe line 14 at the edge of the pad layer 12. While the light beam scans the alignment mark 10 in the Y direction, noise signals 18 are generated by the step differences. Sometimes, the intensities of the three signals (16, 18) are very close. In addition, the shapes of the three signals (16, 18) are similar. Therefore, it is hard to distinguish the real signal 16 from the noise signals 18. Under such condition, the alignment will be not accuracte. In other word, a layer can not match with an underlying layer.

SUMMARY OF THE INVENTION

An alignment mark for improving alignment accuracy is disclosed. The present invention approaches the purpose by changing the wave shape of the noise signal.

The alignment mark includes a cross pattern, two horizontal line patterns having serrated shape. The cross pattern includes a vertical line and a horizontal line. The vertical line is vertical to the scribe line while the horizontal line is parallel to the scribe line. The horizontal patterns are respectively connected to one end of the vertical line. The middles of the horizontal patterns are attached to each end of the vertical line, respectively. One side of the horizontal patterns that is attached to the vertical line has a plurality of serrated shape patterns to change the shape of noise signal. The high H of the serrated shape pattern is about 3 micro meters while the width W of the serrated shape pattern 22 is about 3 micro meters. The distance D between the serrated shape patterns 22 is 3 micro meters.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A new alignment mark for semiconductor process is disclosed to increase the accuracy of an alignment.

Figure 1:
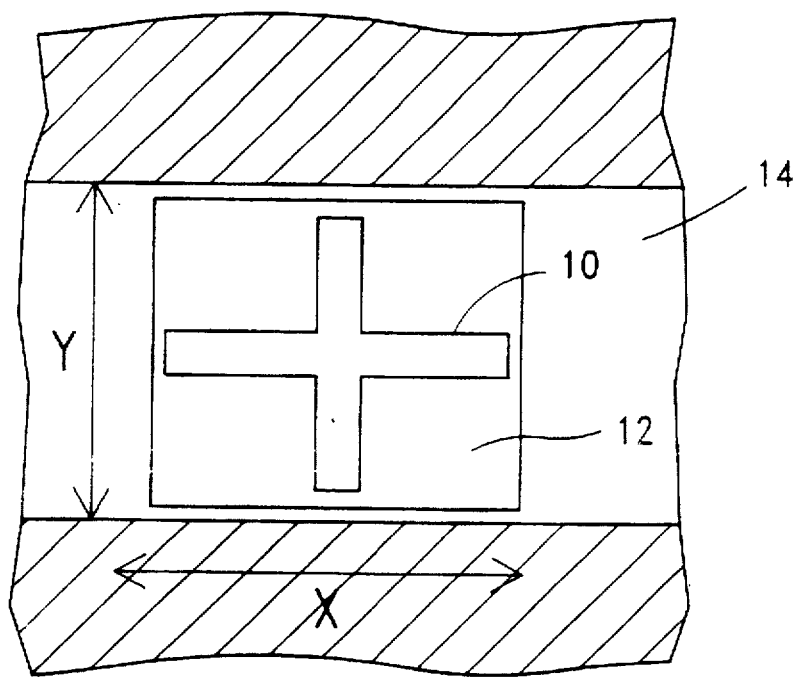
FIG. 1 is a top view of a conventional align mark.
Figure 2:
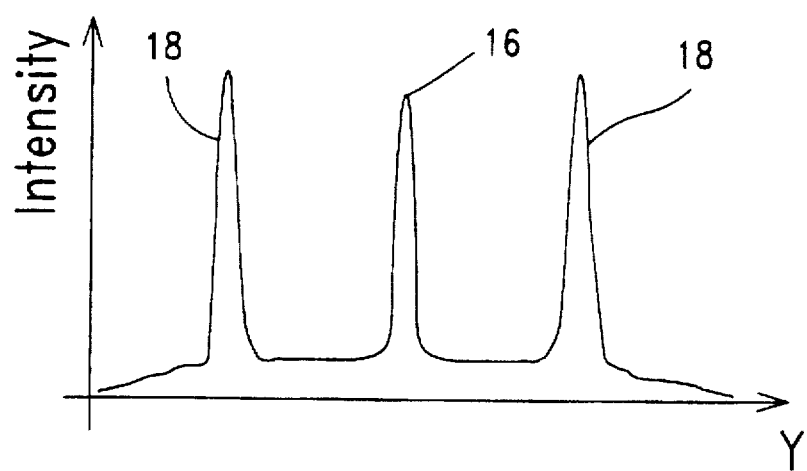
FIG. 2 is an align signal and noise signals of the conventional align mark.
Figure 3:
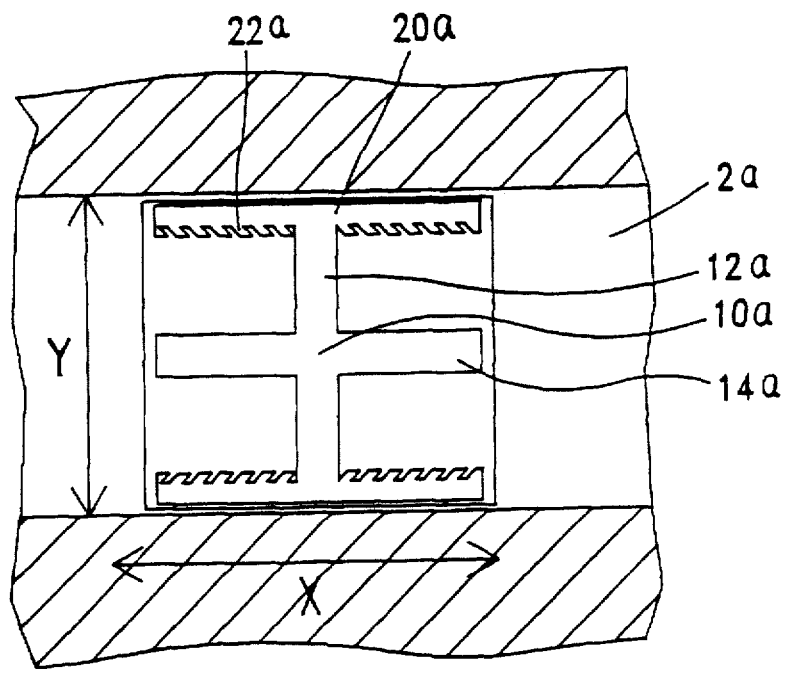
FIG. 3 is a top view of an align mark of the present invention.

The present invention approaches the purpose by changing the shape of the noise signal. Thus it will be easy to tell the real signal from the others. In order to achieve the purpose, a new alignment mark pattern is described herein. A preferred embodiment of the present invention for increasing the accuracy of an alignment is shown in FIG. 3. Typically, the alignment mark is formed over a scribe line 2a.

Still referring to FIG. 3, the alignment mark includes a cross pattern 10a, two horizontal line patterns 20a having waveform 22a. The cross pattern 10a is typically formed over a scribe line 2a for alignment in semiconductor process. The cross pattern 10a includes a vertical line 12a and a horizontal line 14a. The vertical line 12a is vertical to the scribe line 2a while the horizontal line 14a is parallel to the scribe line 2a. In general, the widths of the vertical line 12a and the horizontal line 14a are respectively 2 to 3 micro meters. Moreover, the lengths of the vertical line 12a and the horizontal line 14 depemd on the scribe line design, for example, they are about 80–100 micro meters, respectively. Of course, any suitable width and length of the vertical line 12a can be made, so is the horizontal line 14a.

Figure 4:
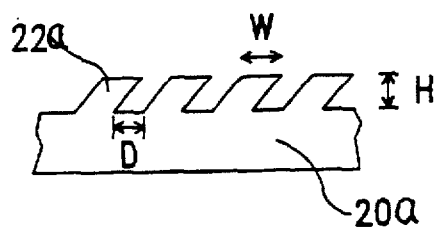
FIG. 4 is a plurality of serrated shape patterns of the present invention.

The horizontal patterns 20a that are parallel to the scribe line 2a are respectively connected to one end of the vertical line 12a. In preferred embodiment, the middle of the horizontal patterns 20a are connected to each end of the vertical line 12a, respectively. The width of the horizontal patterns 20a is about 2 micro meters. The side of the horizontal patterns 20a which is connected to the vertical line 12a has repeatable waveform 22a. The waveform 22a is used to change the shape of a noise signal. The shape of the noise signals on the oscilloscope are changed while the light scans on the alignment pattern due to the interference of the waveform 22a. The waveform 22a can be any suitable shape such as square, triangle. In preferred embodiment, the waveform 22a is serrated wave. As shown in FIG. 4, the height H of the serrated waveform 22a is about 3 micro meters while the width W of the serrated waveform 22a is about 3 micro meters. The distance D between the serrated waveform 22a is 3 micro meters.

Figure 5:
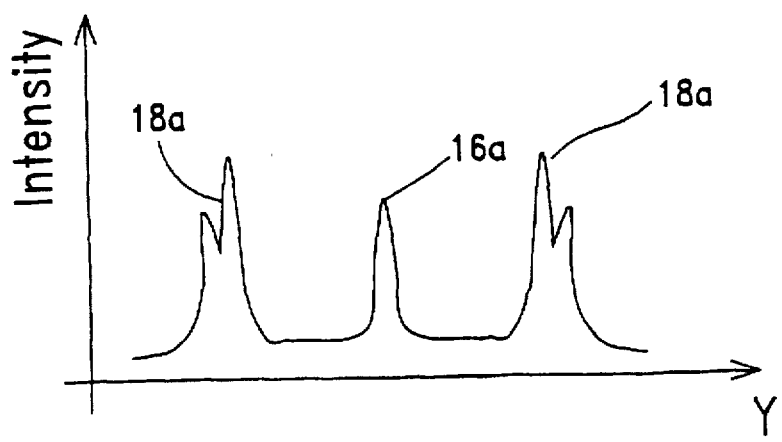
FIG. 5 is an align signal and noise signals of the present invention.

As shown in FIG. 5, in practicing an alignment procedure, while a light beam scans the align mark in Y direction, two noise signals 18a and a real signal 16a are generated by the align mark. It is easy to distinguish the real signal 16a from the noise signals 18a. Therefore, the alignment accuracy will be improved by the present invention.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. An alignment mark pattern for semiconductor process to improve an alignment accuracy, said alignment mark pattern comprising:

a cross pattern having a horizontal line and a vertical line formed over a scribe line for alignment, said horizontal line being parallel to said scribe line, said vertical line being vertical to said scribe line; and noising means having a waveform and being parallel to said scribe line formed over said scribe line for improving said alignment accuracy, said noising means being connected to said vertical line.

2. The alignment mark pattern of claim 1, wherein said waveform is repeatly formed on the side of said noising means that is connected to said vertical line.

3. The alignment mark pattern of claim 2, wherein said waveform is a triangle wave.

4. The alignment mark pattern of claim 2, wherein said waveform is a square wave.

5. The alignment mark pattern of claim 2, wherein said waveform is a serrated wave.

6. The alignment mark pattern of claim 5, wherein the width of said serrated wave is about 3 micro meters.

7. The alignment mark pattern of claim 5, wherein the height of said serrated wave is about 3 micro meters.

8. The alignment mark pattern of claim 5, wherein the distance between said serrated waves is about 3 micro meters.

9. The alignment mark pattern of claim 1, wherein the width of said horizontal line is about 2–3 micro meters.

10. The alignment mark pattern of claim 1, wherein the width of said vertical line is about 2–3 micro meters.

11. The alignment mark pattern of claim 1, wherein the width of said noise means is about 2 micro meters.

12. An alignment mark pattern for semiconductor process to improve an alignment accuracy, said alignment mark pattern comprising:

a cross pattern having a horizontal line and a vertical line formed over a scribe line for alignment, said horizontal line being parallel to said scribe line, said vertical line being vertical to said scribe line;

first noising means having a serrated waveform and being parallel to said scribe line formed over said scribe line for improving said alignment accuracy, said first noising means being connected to a first end of said vertical line; and second noising means having a serrated waveform and being parallel to said scribe line formed over said scribe line for improving said alignment accuracy, said second noising means being connected to a second end of said vertical line.

13. The alignment mark pattern of claim 12, wherein the width of said serrated waveform is about 3 micro meters.

14. The alignment mark pattern of claim 12, wherein the height of said serrated waveform is about 3 micro meters.

15. The alignment mark pattern of claim 12, wherein the distance between said serrated waveform is about 3 micro meters.

16. The alignment mark pattern of claim 12, wherein the width of said horizontal line is about 2–3 micro meters.

17. The alignment mark pattern of claim 12, wherein the width of said vertical line is about 2–3 micro meters.

18. The alignment mark pattern of claim 12, wherein the width of said noise means is about 3 micro meters.

* * * * *